US010090227B1

(12) United States Patent
Pawlak et al.

(10) Patent No.: US 10,090,227 B1
(45) Date of Patent: Oct. 2, 2018

(54) BACK BIASING IN SOI FET TECHNOLOGY (71) Applicant: GLOBALFOUNDRIES Inc., Grand Cayman (KY)

(72) Inventors: Bartlomiej Pawlak, Leuven (BE); Luke England, Saratoga Springs, NY (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 15/648,602

(22) Filed: Jul. 13, 2017

(51) Int. Cl.
*H01L 23/48* (2006.01)
*H01L 27/12* (2006.01)
*H01L 23/532* (2006.01)
*H01L 23/528* (2006.01)
*H01L 21/768* (2006.01)
*H01L 21/56* (2006.01)

(52) U.S. Cl.
CPC .......... *H01L 23/481* (2013.01); *H01L 21/561* (2013.01); *H01L 21/76898* (2013.01); *H01L 23/5283* (2013.01); *H01L 23/5286* (2013.01); *H01L 23/5329* (2013.01); *H01L 27/1203* (2013.01)

(58) Field of Classification Search
CPC ............... H01L 23/481; H01L 23/5286; H01L 27/1203; H01L 27/1207; H01L 27/0274; H01L 27/0285; H01L 29/7812
See application file for complete search history.

(56) References Cited

U.S. PATENT DOCUMENTS

| 8,674,470 | B1 | 3/2014 | Or-Bach et al. |
| 8,803,206 | B1 | 8/2014 | Or-Bach et al. |
| 2008/0197914 | A1 | 8/2008 | Shimizu et al. |
| 2017/0373026 | A1* | 12/2017 | Goktepeli ........... H01L 27/1464 |

OTHER PUBLICATIONS de Streel and Bol, "Study of Back Biasing Schemes for ULV Logic from the Gate Level to the IP Level," J. Low Power Electron. Appl., 4:168-87, 2014.

* cited by examiner

*Primary Examiner* — Hoai V Pham
(74) *Attorney, Agent, or Firm* — Amerson Law Firm, PLLC (57) ABSTRACT

In one aspect, the present disclosure provides a semiconductor device structure with a silicon-on-insulator (SOI) substrate composed of an active layer, a substrate and a buried insulating layer which is positioned on an upper surface of the substrate and below a lower surface of the active layer. At least one gate electrode having a channel region below is positioned above an upper surface of the active layer and at least one vertical connection element extends between the upper surface of the substrate and an opposite lower surface of the substrate below the at least one gate electrode. The at least one vertical connection element serves for back-biasing FETs with back-bias contacts at the rear side of the wafer.

20 Claims, 6 Drawing Sheets

BACK BIASING IN SOI FET TECHNOLOGY

BACKGROUND

1. Field of the Disclosure

The present disclosure generally relates to semiconductor device fabrication and, more particularly, to vertical connection elements in silicon-on-insulator (SOI) technology.

2. Description of the Related Art

The development of advanced semiconductor device structures has led to the integration of an increasing number of semiconductor devices (e.g., transistors, capacitors, resistors and the like) into an integrated circuit on a semiconductor wafer. To date, the observation or projection of Moore's law is proven accurate, driving research and development in the semiconductor industry to smaller technology nodes, currently scheduled to hold at a 10 nm width in late 2017, as the result of a very aggressive scaling subjected to semiconductor devices for increasing the number or density of semiconductor devices per integrated circuit.

Generally, there are two main classes of components in complementary metal oxide semiconductor (CMOS) ICs, namely, transistors and interconnections. Although the performance and density of transistors typically improve with advanced scaling, the performance of interconnects or wires that connect transistors degrade upon scaling. Therefore, the performance, functionality and power consumption of ICs is dominated by the fabrication of interconnections.

Interconnections are implemented by one or more connection elements, such as leads, wires and vias (Latin for path or way, also known as Vertical Interconnect Access). Generally, a via is an electrical connection between layers in a physical electronic circuit that goes through the plane of one or more adjacent layers, i.e., vertically crossing at least one layer in a physical electronic circuit.

However, the continuous scaling of semiconductor devices leads to several issues. For example, upon decreasing the geometry of semiconductor devices, the leakage power of semiconductor devices increases exponentially due to the fact that operating characteristics of transistors change upon scaling, especially with regard to the effect of a threshold voltage $V_{TH}$. The threshold voltage $V_{TH}$ represents the voltage at which a transistor switches from a conducting state to a non-conducting state and vice versa. Generally, the scaling of transistors effects a scaling of the threshold voltage $V_{TH}$ relative to the supply voltage, thereby leading to an increase in the leakage power, which more and more becomes a dominant factor in the power consumption during standby mode of transistors at advanced technology nodes, i.e., the effect of leakage power becomes more significant in standby mode at advanced technology nodes. Therefore, with regard to advanced mobile or battery operated devices, the leakage power is an important issue limiting the power supply capacity and the operation times of such mobile or battery operated devices.

A known approach for reducing power consumption due to leakage current is to provide a back bias, which allows the provision of additional control over leakage performance of transistors by applying a biasing voltage to a backside of a wafer substrate.

Another approach to cope with the challenges of meeting Moore's law is the so-called "silicon-on-insulator" (SOI) technology which refers, for instance, to the use of a layered silicon-insulator-silicon substrate in place of conventional bulk silicon substrates in semiconductor manufacturing, especially microelectronics, to reduce parasitic device capacitance, thereby improving performance. SOI-based devices differ from conventional bulk silicon devices in that the silicon junction is above an electrical insulator, typically silicon dioxide or sapphire (these types of devices are called silicon-on-sapphire, or SOS). The choice of insulator depends largely on intended application, with sapphire being used for high-performance radio frequency (RF) and radiation-sensitive applications, and silicon dioxide for diminished short channel effects in microelectronics devices.

Currently advanced approaches for fabricating aggressively scaled semiconductor devices in accordance with the SOI technology employ the so-called "fully depleted semiconductor-on-insulator" (FDSOI) technology, which is considered as promising candidates for the fabrication of IoT applications. Herein, when compared to standard SOI technology, a much thinner uppermost or active layer (e.g., silicon) is used, which, when compared to standard SOI technologies with relatively thicker active layers, offers good control of gates over channel regions.

In FDSOI technologies, back-biasing (also referred to as body biasing) is considered as improving the performance of semiconductor devices for very low voltages with extremely low leakage. Herein, a biasing voltage is applied under the buried oxide of SOI substrates having target transistors. Doing so changes the electrostatic control of the transistors and shifts their threshold voltage $V_{TH}$ to either obtain more drive current (and, hence, higher performance at the expense of increased leakage current) at forward back bias or cut the leakage current at the expense of reduced performance at reverse back bias.

While back bias in planar FDSOI technology is somewhat similar to body bias that can be implemented in bulk CMOS technology, it offers a number of key advantages in terms of level and efficiency of the bias that can be applied. For example, back-biasing may be applied in a dynamic manner, particularly on a block-by-block basis. It is considered to boost performance during limited periods of time when maximum peak performance is required from a specific block of an IC. It can also be used to cut leakage during the periods of time when limited performance is not an issue.

In current devices, back-biasing challenges the design of aggressively scaled ICs and involves area penalties in the design of contacts, which reduce available circuit area on semiconductor wafers.

In view of the above-described situation and problems, it is, therefore, desirable to provide a semiconductor device structure and a method of fabricating semiconductor device structures wherein area penalties associated with back-biasing are at least reduced, if not avoided.

SUMMARY OF THE DISCLOSURE

The following presents a simplified summary of the disclosure in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

In a first aspect, the present disclosure provides a semiconductor device structure. In accordance with some illustrative embodiments herein, the semiconductor device structure may include a semiconductor-on-insulator (SOI) substrate having an active layer, a substrate, and a buried insulating layer position on an upper surface of the substrate and below a lower surface of the active layer, at least one gate electrode positioned above an upper surface of the active layer, and at least one vertical connection element extending between the upper surface of the substrate and an opposite lower surface of the substrate below the at least one gate electrode.

In a second aspect, the present disclosure provides a semiconductor device structure. In accordance with some illustrative embodiments herein, the semiconductor device structure may include a semiconductor-on-insulator (SOI) substrate having an active layer, a substrate and a buried insulating layer positioned on an upper surface of the substrate and below a lower surface of the active layer, at least one gate electrode positioned above an upper surface of the active layer, at least one vertical connection element extending between the upper surface of the substrate and an opposite lower surface of the substrate below the at least one gate electrode, and a grid of a plurality of grid lines positioned in the substrate at the upper surface of the substrate, the plurality of grid lines being in mechanical contact with the buried insulating layer, wherein the vertical connection element has a vertical portion which at least partially encloses a dielectric material, the dielectric material being positioned on the lower surface of the substrate and partially extending into the substrate, and a horizontal portion which at least partially extends between the buried insulating material and the dielectric material.

In a third aspect, the present disclosure provides a method. In accordance with some illustrative embodiments disclosed herein, the method may include providing a semiconductor-on-insulator (SOI) having an active layer, a substrate, and a buried insulating layer positioned on an upper surface of the substrate and below a lower surface of the active layer, and forming at least one vertical connection element in the substrate, the vertical connection element extending between the upper surface of the substrate and an opposite lower surface of the substrate.

BRIEF DESCRIPTION OF THE DRAWINGS

The disclosure may be understood by reference to the following description taken in conjunction with the accompanying drawings, in which like reference numerals identify like elements, and in which.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

In the following description, for the purposes of explanation, numerous specific details are set forth in order to provide a thorough understanding of exemplary embodiments. It should be apparent, however, that exemplary embodiments may be practiced without these specific details or with an equivalent arrangement. In other instances, well-known structures and devices are shown in block diagram form in order to avoid unnecessarily obscuring exemplary embodiments. In addition, unless otherwise indicated, all numbers expressing quantities, ratios and numerical properties of ingredients, reaction conditions and so forth used in the specification and claims are to be understood as being modified in all instances by the term "about."

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present disclosure will now be described with reference to the attached figures. Various structures, systems and devices are schematically depicted in the drawings for purposes of explanation only and so as to not obscure the present disclosure with details which are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary or customary meaning as understood by those skilled in the art, is intended to be implied by consistent usage of the term or phrase herein. To the extent that a term or phrase is intended to have a special meaning, i.e., a meaning other than that understood by skilled artisans, such a special definition shall be expressively set forth in the specification in a definitional manner that directly and unequivocally provides the special definition for the term or phrase.

A semiconductor device structure as described below with regard to some illustrative embodiments of the present disclosure may comprise at least one semiconductor device. Generally, semiconductor devices, such as PMOS and NMOS devices, of the present disclosure may concern devices which are fabricated by using advanced technologies, i.e., the semiconductor devices may be fabricated by technologies applied to approach technology nodes smaller than 100 nm, for example, smaller than 50 nm or smaller than 35 nm or smaller than 22 nm, e.g., at 10 nm or below. The person skilled in the art will appreciate that, according to the present disclosure, ground rules smaller or equal to 45 nm or smaller or equal to 22 nm, e.g., at 10 nm or below, may be imposed. The person skilled in the art will appreciate that the present disclosure proposes capacitor structures having minimal length dimensions and/or width dimensions smaller than 100 nm, for example, smaller than 50 nm or smaller than 35 nm or smaller than 22 nm, e.g., at 10 nm or below. For example, the present disclosure may provide structures fabricated by using 22 nm technologies or below, e.g., 10 nm or even below.

The person skilled in the art will appreciate that, although a semiconductor device may be provided by a MOS device, the expression "MOS" does not imply any limitation, i.e., a MOS device is not limited to a metal-oxide-semiconductor configuration, but may also comprise a semiconductor-oxide-semiconductor configuration and the like. Furthermore, the expression "semiconductor device structure" may comprise a structure having at least one semiconductor device formed at the device level of an integrated circuit, e.g., at least one of an NMOS device and a PMOS device formed in and above a semiconductor substrate.

Regarding the wording "on," "over" and the like, no limitation is intended and, upon stating that "an element A is on an element B," the elements A and B may be in direct contact or may have at least one further element C formed in between. Accordingly, wordings such as "under," "below" and the like are not to be taken as limiting the present disclosure to the case that an element A is in direct contact with an element B formed below or under the element A, but that at least one further element C may be formed in between.

Figure 1:
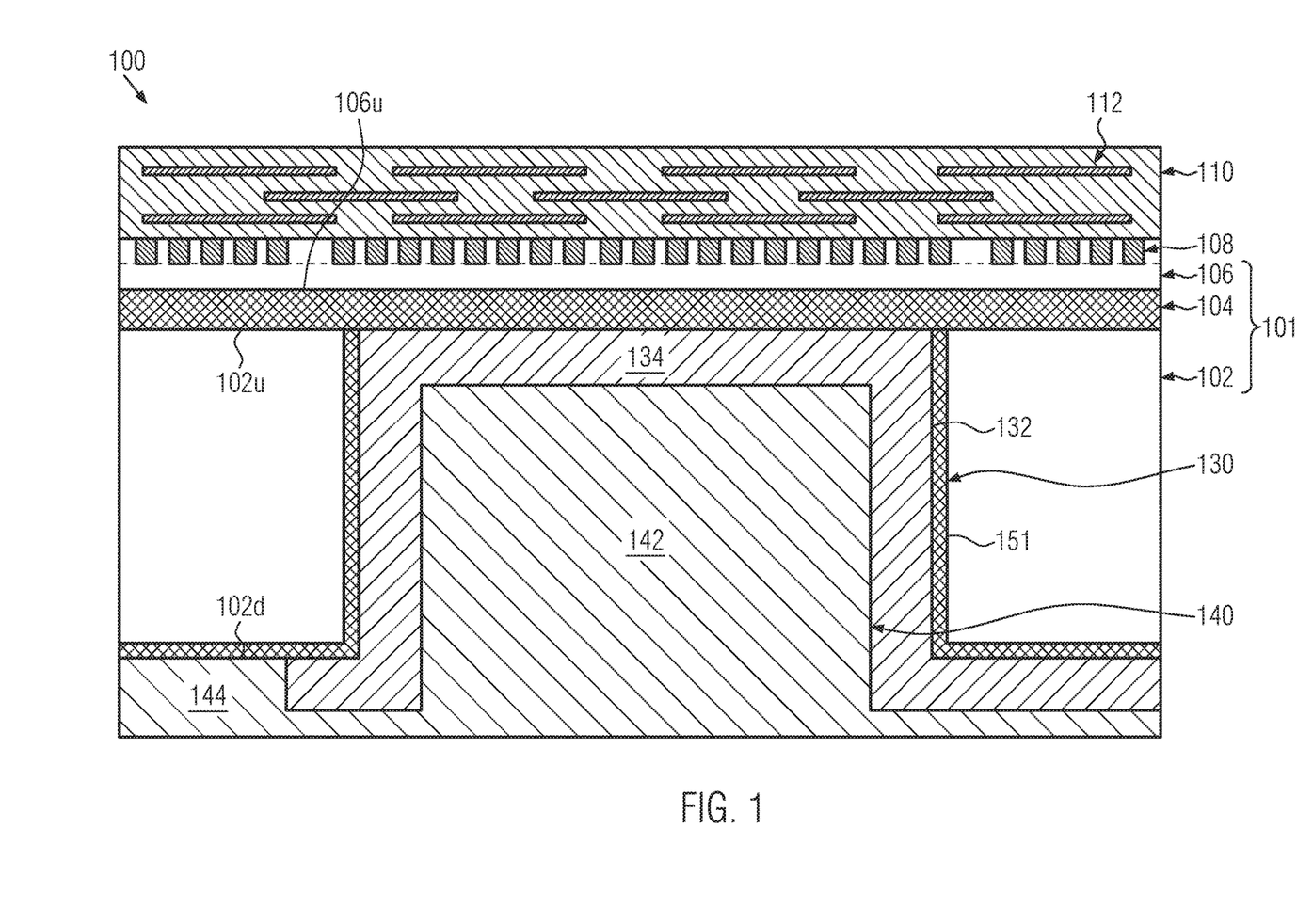
FIG. 1 schematically illustrates, in a cross-sectional view, a semiconductor device structure in accordance with some illustrative embodiments of the present disclosure.

FIG. 1 schematically illustrates, in a cross-sectional view, a semiconductor device structure 100 in accordance with some illustrative embodiments of the present disclosure. The semiconductor device structure 100 may comprise a semi-conductor-on-insulator (SOI) substrate 101 having an active layer 106, a bulk substrate 102, and a buried insulating layer 104 formed on an upper surface 102u of the substrate 102 and below a lower surface 106u of the active layer 106.

In accordance with some illustrative embodiments of the present disclosure, the SOI substrate 101 may be provided in accordance with known SOI fabrication techniques, such as smart cut or SIMOX.

In accordance with some illustrative embodiments of the present disclosure, the substrate 102 of the SOI substrate 101 may comprise a semiconductor material (e.g., silicon, germanium, silicon germanium and the like) formed on an insulating material (e.g., an oxide material or a nitride material) which, in turn, may be formed on a semiconductor substrate material.

In accordance with some special illustrative embodiments of the present disclosure, the substrate 102 may comprise monocrystalline silicon having a plane orientation of (100) or may be one of a silicon-based substrate, a germanium-based substrate and the like, as known in the art.

In accordance with some illustrative embodiments of the present disclosure, the active layer 106 may, for example, be provided by P-type monocrystalline silicon having a plane orientation of (100), (110) or (100) parallel to an orientation flat or notch. In accordance with some illustrative embodiments of the present disclosure, the active layer 106 may have a thickness of about 30 nm or less, e.g., in the range of about 10-20 nm.

In accordance with some special illustrative embodiments of the present disclosure, the buried insulating layer 104 may be formed of one of silicon oxide and silicon nitride. In accordance with some illustrative embodiments of the present disclosure, the buried insulating layer 104 may have a thickness of about 45 nm or less, e.g., 20 nm. For example, the buried insulating layer 106 may have a thickness in the range from about 10-30 nm, when FDSOI techniques are employed. In accordance with ultrathin FDSOI (UTFDSOI) techniques, the buried insulating layer 104 may have a thickness in the range from about 2-10 nm.

In accordance with some illustrative embodiments of the present disclosure, a plurality of active and/or passive devices, such as MOSFETS, capacitors, resistors and the like, may be provided in and/or on the active layer 106. For example, a plurality of gate electrodes 108 may be formed on the active layer 106 (the gate electrodes 108 may be embedded into an interlayer dielectric formed on the active layer 106, as indicated by a broken line in FIG. 1), wherein the at least one gate electrode 108 may be separated from the active layer 106 by means of a gate dielectric (not illustrated) interposed between each gate 108 and the active layer 106. The person skilled in the art will appreciate that device elements, such as source/drain regions, silicide regions, contacts to source/drain, interlayer dielectric (ILD) materials (e.g., oxide material(s) and/or nitride material(s) and/or low-k material(s) and the like) laterally enclosing gate electrodes, and the like, are not indicated in FIG. 1 for the ease of illustration.

Over the active layer 106, a metallization layer stack 110 comprising connection lines 112 which extend horizontally in metallization layers (interfaces of the metallization layers are not indicated for ease of illustration), and vias (not illustrated) interconnecting adjacent metallization layers may be formed. The metallization layers 110 (also referred to as "back end of line," BEOL) may be composed of a plurality of insulating layers, metal levels, bonding sites, contacts and the like.

As shown in FIG. 1, a vertical connection element 130 may be formed in the substrate of the SOI substrate 101, the vertical connection element 130 extending between the upper surface 102u of the substrate 102 and a lower surface 102d of the bulk surface 102, the lower surface 102d being opposite to the upper surface 102u of the substrate 102. Although only one vertical connection element 130 is schematically illustrated in FIG. 1, this does not pose any limitation and the person skilled in the art will appreciate that more than one vertical connection element may be provided in the substrate 102.

Referring to FIG. 1, the vertical connection element 130 may be formed as a hollow vertical connection element 130, wherein the vertical connection element 130 may comprise a vertical portion 132 which extends vertically in the substrate 102 and a horizontal portion 134 which extends substantially horizontally in the substrate 102. The vertical portion may at least partially enclose a dielectric material 140 which may be deposited on a backside surface of the semiconductor device structure 100.

In accordance with some illustrative embodiments of the present disclosure, a liner 151 may be formed between the connection element 130 and the surrounding substrate 102, wherein the liner 151 separates the connection element 130 and the surrounding substrate 102. In accordance with some illustrative examples herein, the liner 151 may comprise a dielectric material, such as a nitride material or an oxide material. The person skilled in the art will appreciate that the liner 151 may allow efficiently allocating an area to be impacted by back-biasing.

In accordance with some illustrative embodiments of the present disclosure, the dielectric material 140 may comprise a filling portion 142 which may at least partially extend into the substrate 102 and may fill an opening in the vertical connection element 130. Furthermore, the dielectric material 140 may comprise a material portion 144 which may be formed on and in direct contact with the lower surface 102d of the substrate 102. In accordance with some illustrative examples, the dielectric material 140 may comprise a polymer material, such as polyimide (PI).

In accordance with some illustrative embodiments of the present disclosure, the vertical connection element 130 may comprise copper, tungsten and the like.

In accordance with some illustrative embodiments of the present disclosure, the vertical connection element 130 may be very much adjacent to the buried insulating layer 104, e.g., in mechanical contact with the buried insulating layer 104. For example, the vertical connection element 130 may partially cover a lower surface of the buried insulating layer 104. In accordance with some illustrative examples herein, the horizontal portion 134 may have a common interface with the buried insulating layer 104 and may extend in parallel to the buried insulating layer 104 at the upper surface 102u of the substrate 102.

In accordance with some illustrative embodiments of the present disclosure, the vertical connection element 130 may allow applying a back-biasing voltage to a subset of channels regions (not illustrated) of semiconductor devices formed in the active layer 106 (corresponding to a subset of gate electrodes of the plurality of gate electrodes 108 formed on the active layer 106). After a complete reading of the present disclosure, the person skilled in the art will appreciate that the vertical connection element 130 may allow applying a back-biasing voltage to at least some of the gate electrodes formed on the SOI substrate 101 without consuming an area of the active layer 106 of the SOI substrate 101. Accordingly, the vertical connection element 130 may allow eliminating front-side contacts which are used in conventional SOI technology when implementing known back-biasing schemes.

After a complete reading of the present disclosure, the person skilled in the art will appreciate that, upon appropriately selecting sizes and shapes of the vertical connection element 130, designers may be free to design blocks that need to be back-biased with regard to their size on the SOI substrate 101 without imposing any area penalties due to back-biasing.

Although FIG. 1 schematically illustrates the vertical connection element 130 as a hollow vertical connection element being filled with a dielectric material 140, the person skilled in the art will appreciate that this does not pose any limitation to the present disclosure and the filling portion 142 may be replaced by the material of the vertical connection element, thereby implementing a non-hollow vertical connection element 130.

Figure 2:
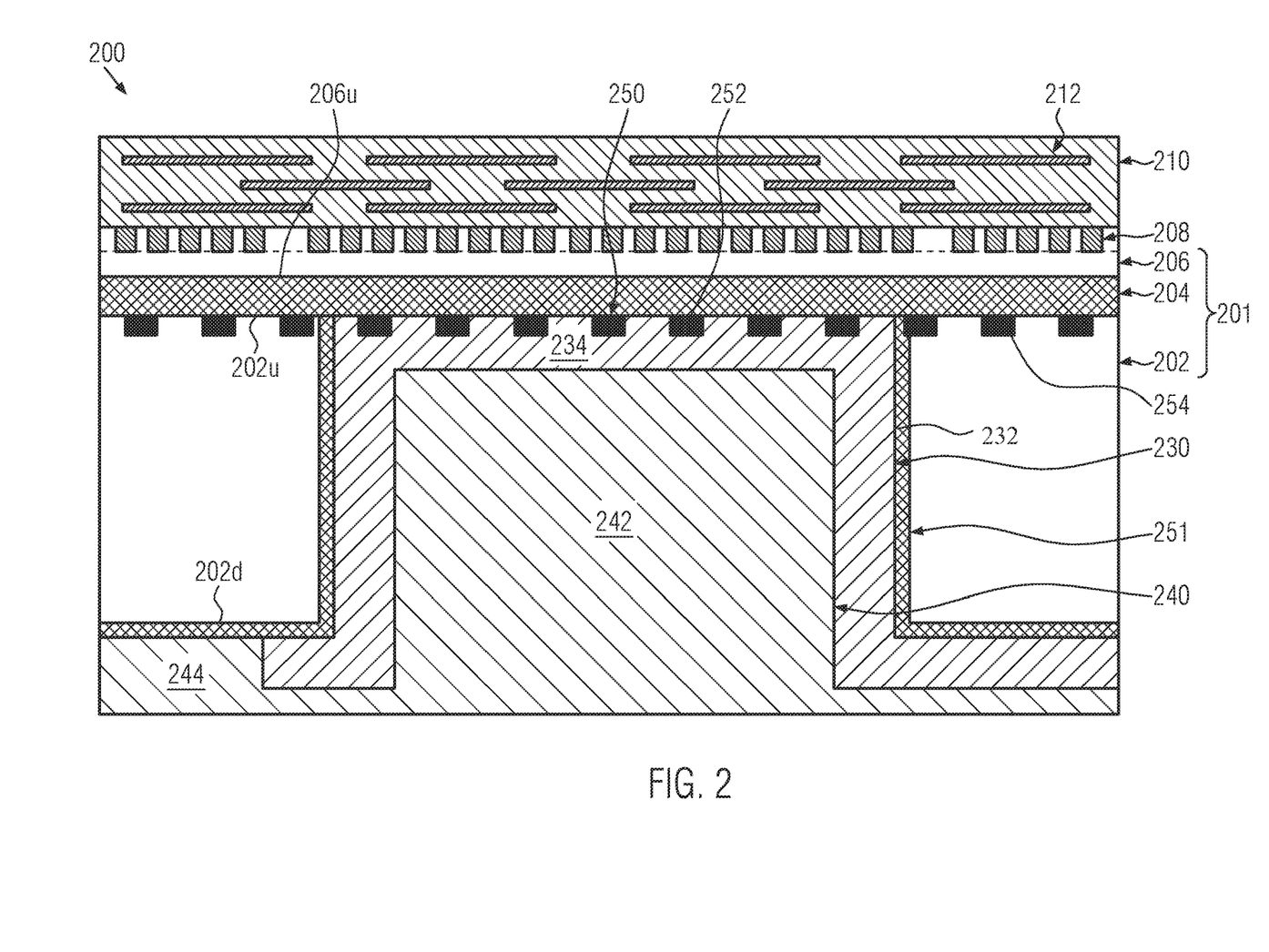
FIG. 2 schematically illustrates, in a cross-sectional view, a semiconductor device structure in accordance with other illustrative embodiments of the present disclosure.

Referring to FIG. 2, a semiconductor device structure 200 is schematically illustrated in accordance with some illustrative embodiments of the present disclosure in a cross-sectional view. The semiconductor device structure 200 may comprise a semiconductor-on-insulator (SOI) substrate 201 having an active layer 206, a substrate 202, and a buried insulating layer 204 formed on an upper surface 202u of the substrate 202 and below a lower surface 206u of the active layer 206.

In accordance with some illustrative embodiments of the present disclosure, the SOI substrate 201 may be provided in accordance with known SOI fabrication techniques, such as smart cut or SIMOX.

In accordance with some illustrative embodiments of the present disclosure, the substrate 202 of the SOI substrate 201 may comprise a semiconductor material (e.g., silicon, germanium, silicon germanium and the like) formed on an insulating material (e.g., an oxide material or a nitride material) which, in turn, may be formed on a semiconductor substrate material.

In accordance with some special illustrative embodiments of the present disclosure, the substrate 202 may comprise monocrystalline silicon having a plane orientation of (100) or may be one of a silicon-based substrate, a germanium-based substrate and the like, as known in the art.

In accordance with some illustrative embodiments of the present disclosure, the active layer 206 may, for example, be provided by P-type monocrystalline silicon having a plane orientation of (100), (110) or (100) parallel to an orientation flat or notch. In accordance with some illustrative embodiments of the present disclosure, the active layer 206 may have a thickness of about 30 nm or less, e.g., in the range of about 10-20 nm.

In accordance with some illustrative embodiments of the present disclosure, the buried insulating layer 204 may have a thickness of about 45 nm or less. For example, the buried insulating layer 204 may have a thickness in the range from about 10-30 nm, when FDSOI techniques are employed. In accordance with ultrathin FDSOI (UTFDSOI) techniques, the buried insulating layer 204 may have a thickness in the range from about 2-10 nm.

In accordance with some illustrative embodiments of the present disclosure, a plurality of active and/or passive devices, such as MOSFETS, capacitors, resistors and the like, may be provided in and on the active layer 206. For example, a plurality of gate electrodes 208 may be formed on the active layer 206 (the gate electrodes 208 may be embedded into an interlayer dielectric formed on the active layer 206, as indicated by a broken line in FIG. 2), the at least one gate electrode 208 being separated from the active layer 206 by means of a gate dielectric (not illustrated) interposed between each gate 208 and the active layer 206. The person skilled in the art will appreciate that device elements, such as source/drain regions, silicide regions, contacts to source/drain, interlayer dielectric materials laterally enclosing gate electrodes and the like, are not indicated in FIG. 2 for the ease of illustration.

Over the active layer 206, a metallization layer stack 210 comprising connection lines 212 which horizontally extend in metallization layers (interfaces of metallization layers are not explicitly depicted for the ease of illustration), and vias (not illustrated) interconnecting adjacent metallization layers, may be formed. The metallization layers 210 (also referred to as back end of line, BEOL) may be composed of a plurality of insulating layers, metal levels, bonding sites, contacts and the like.

As shown in FIG. 2, a vertical connection element 230 may be formed in the substrate of the SOI substrate 201, the vertical connection element 230 extending between the upper surface 202u of the substrate 202 and a lower surface 202d of the substrate 202, the lower surface 202d being opposite to the upper surface 202u of the substrate 202. Although only one vertical connection element 230 is schematically illustrated in FIG. 2, this does not pose any limitation and the person skilled in the art will appreciate that more than one vertical connection element may be provided in the substrate 202.

Referring to FIG. 2, the vertical connection element 230 may be formed as a hollow vertical connection element 230, wherein the vertical connection element 230 may comprise a vertical portion 232 extending vertically in the substrate 202 and a horizontal portion 234 extending horizontally in the substrate 202. The vertical portion 232 may at least partially enclose a dielectric material 240 which may be deposited on a backside surface of the semiconductor device structure 200.

In accordance with some illustrative embodiments of the present disclosure, a liner 251 may be formed between the connection element 230 and the surrounding substrate 202, wherein the liner 251 separates the connection element 230 and the surrounding substrate 202. In accordance with some illustrative examples herein, the liner 251 may comprise a dielectric material, such as a nitride material or an oxide material. The person skilled in the art will appreciate that the liner 251 may allow efficiently allocating an area to be impacted by back-biasing.

In accordance with some illustrative embodiments of the present disclosure, the dielectric material 240 may comprise a filling portion 242 which may at least partially extend into the substrate 202 and may fill an opening in the vertical connection element 230. Furthermore, the dielectric material 240 may comprise a material portion 244 which may be formed on and in direct contact with the lower surface 202d of the substrate 202. In accordance with some illustrative examples, the dielectric material 240 may comprise a polymer material, such as polyimide (PI).

In accordance with some illustrative embodiments of the present disclosure, the vertical connection element 230 may comprise copper, tungsten and the like.

In accordance with some illustrative embodiments of the present disclosure, the vertical connection element 230 may be very much adjacent to the buried insulating layer 204, e.g., in mechanical contact with the buried insulating layer 204. For example, the vertical connection element 230 may partially cover a lower surface of the buried insulating layer 204. In accordance with some special illustrative examples herein, the horizontal portion 234 may have a common interface with the buried insulating layer 204 and may extend in parallel to the buried insulating layer 204 at the upper surface 202u of the substrate 202.

In accordance with some illustrative embodiments of the present disclosure, the vertical connection element 230 may allow applying a back-biasing voltage with regard to a subset of gate electrodes of the plurality of gate electrodes 208 formed on the active layer 206. After a complete reading of the present disclosure, the person skilled in the art will appreciate that the vertical connection element 230 may allow applying a back-biasing voltage to at least some of the gate electrodes formed on the SOI substrate 201 without consuming an area of the active layer 206 of the SOI substrate 201. Accordingly, the vertical connection element 230 allows for elimination of front-side contacts used when back-biasing schemes are implemented in conventional techniques.

After a complete reading of the present disclosure, the person skilled in the art will appreciate that, upon appropriately selecting sizes and shapes of the vertical connection element 230, designers may be free to design blocks that need to be back-biased with regard to their size on the SOI substrate 201 without imposing any area penalties due to back-biasing.

Although FIG. 2 schematically illustrates the vertical connection element 230 as a hollow vertical connection element being filled with a dielectric material 240, this does not pose any limitation to the present disclosure and the filling portion 242 may be replaced by the material of the vertical connection element, thereby implementing a non-hollow vertical connection element 230.

As depicted in FIG. 2, a grid 250 may be provided. In accordance with some illustrative embodiments of the present disclosure, the grid 250 may be formed by a plurality of metal grid lines (metal grid lines indicated with reference numerals 252 and 254 represent non-limiting examples) extending in parallel to the buried insulating layer 204 at the upper surface 202u of the substrate 202. The person skilled in the art will appreciate that, in general, at least one conductive line element (e.g., the grid line 252) may be formed, the at least one conductive line element (the grid line 252) extending horizontally in the substrate 202 at the upper surface 202u of the substrate 202. In accordance with some illustrative embodiments of the present disclosure, the metal grid lines 252 and 254 comprise tungsten.

In accordance with some illustrative embodiments of the present disclosure, the grid 250 or at least one conductive line element, e.g., the metal grid line 252, may be in mechanical contact with the buried insulating layer 204 and the vertical connection element 230.

In accordance with some illustrative embodiments of the present disclosure, a subset of grid lines of the grid 250, e.g., at least the grid line 252, may be partially embedded into the vertical connection element 230, i.e., the horizontal portion 234. Accordingly, the vertical connection element 230 may allow applying a back-biasing voltage to at least some grid lines of the grid 250.

In accordance with some illustrative embodiments of the present disclosure, at least some of the grid lines of the grid 250 may be externally contacted from the back-side of the wafer.

Referring to FIG. 2, an insulating material layer 251 is schematically illustrated, the insulating material layer 251 being formed of one of an oxide material and a nitride material separating the vertical connection element 230 from the laterally enclosing substrate 202. The person skilled in the art will appreciate that a desired back-biasing voltage may be applied to at least some of the channels (not illustrated) underneath the gate electrodes 208 by appropriately contacting grid lines 252 of the grid 250 by means of the vertical connection element 230 without affecting the adjacent material of the substrate 202. In this way, different back bias voltage levels may be applied to different blocks of gate electrodes. In accordance with some special illustrative embodiments herein, the insulating material layer 251 may have a thickness of at most about 20 nm.

In accordance with some special illustrative embodiments of the present disclosure, the grid 250 may be formed of tungsten.

In accordance with some illustrative embodiments of the present disclosure, the vertical connection element 130 and/or the vertical connection element 230 (as described above with regard to FIGS. 1 and/or 2) may be formed when providing a redistribution layer (RDL) on the backside of the SOI substrate 101 and/or 201.

With regard to FIGS. 3a-3c, some illustrative embodiments of the present disclosure will be described.

Figure 3A:
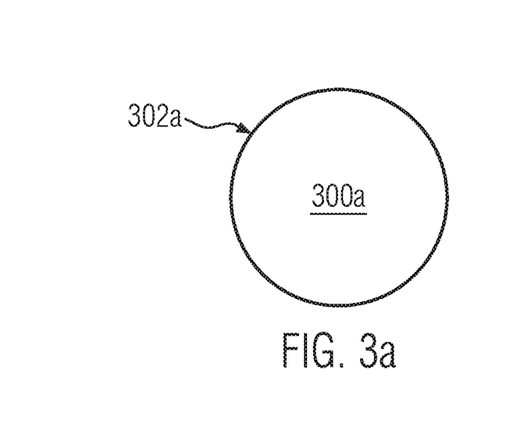
FIGS. 3a and 3b schematically illustrate, in cross-sectional views, a vertical connection element in accordance with various illustrative embodiments of the present disclosure.

FIG. 3a schematically illustrates, in a cross-sectional view (the cross-section in FIG. 3a is taken in parallel to the surface 102u and/or 202u in FIGS. 1 and/or 2), a vertical connection element 300a having a circular shape 302a. After a complete reading of the present disclosure, the person skilled in the art will appreciate that the vertical connection element 300a may be one of a hollow vertical connection element and a non-hollow vertical connection element.

Figure 3B:
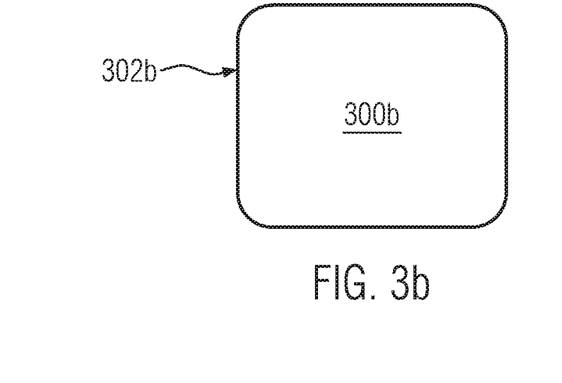

FIG. 3b schematically illustrates, in a cross-sectional view (the cross-section in FIG. 3b is taken in parallel to the surface 102u and/or 202u in FIGS. 1 and/or 2), a vertical connection element 300b having a rectangular shape 302b. After a complete reading of the present disclosure, the person skilled in the art will appreciate that the vertical connection element 300b may be one of a hollow vertical connection element and a non-hollow vertical connection element.

After a complete reading of the present disclosure, the person skilled in the art will appreciate that the circular shape 302a as illustrated in FIG. 3a and the rectangular shape 302b as illustrated in FIG. 3b do not pose any limitation to the present disclosure and a polygonal or more generally, an irregular shape, may be provided instead.

Figure 3C:
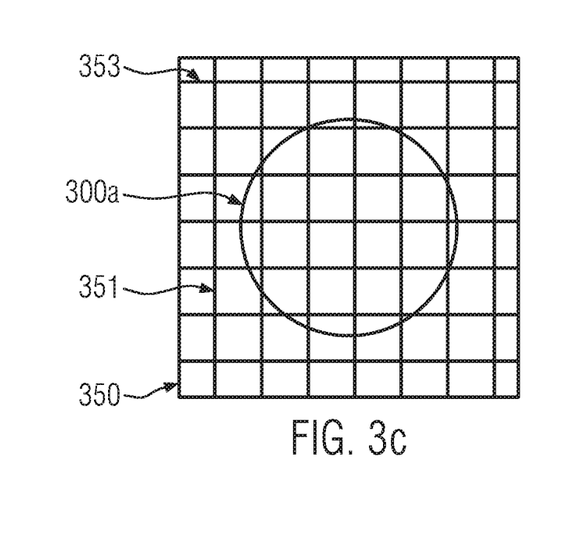
FIG. 3c schematically illustrates, in a cross-sectional view, an arrangement of a vertical connection element and a grid in accordance with some illustrative embodiments of the present disclosure.

With regard to FIG. 3c, a back-biasing area is schematically illustrated in a top view. The back-biasing area may comprise a grid 350 having grid lines 351 extending widthwise and grid lines 353 extending lengthwise. The person skilled in the art will appreciate that an orientation of the grid lines 351 and 353 may be arbitrary, however, the grid lines 351 and 353 may be mutually perpendicular (in general, the grid lines 351 and 353 may be mutually askew).

Although a square grid shape is schematically illustrated in FIG. 3c, this does not pose any limitation to the present disclosure and the person skilled in the art will appreciate that any shape, even irregular, may be used in accordance with a specific target back-biasing area. Accordingly, the person skilled in the art will appreciate that, upon employing the grid 350, the back-biasing may be expanded to the back-biasing area covered by the grid 350 and is, therefore, not confined to a size, particularly an interface between the vertical connection element 300a and the buried insulating layer (not illustrated in FIG. 3c; e.g., see buried insulating layer 104 in FIG. 1 and/or 204 in FIG. 2).

With regard to FIGS. 4a-4d, a process flow in accordance with some illustrative embodiments of the present disclosure is schematically illustrated.

Figure 4A:
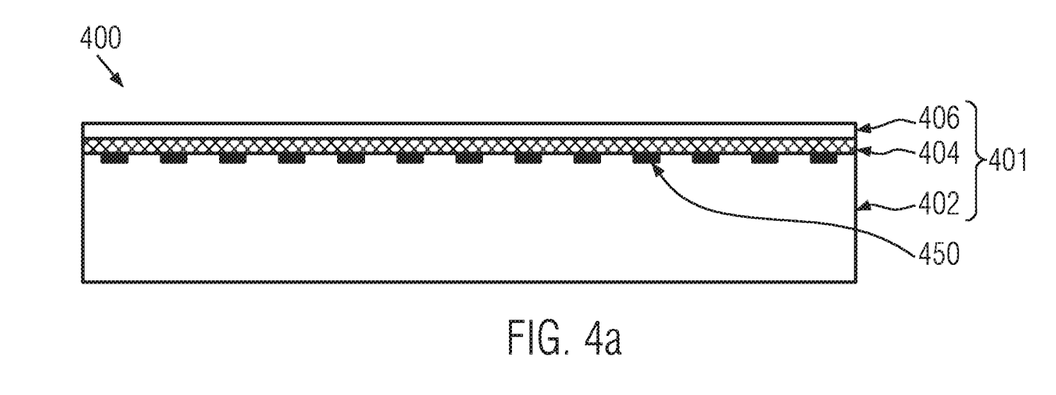
FIGS. 4a-4d schematically illustrate a process flow in accordance with some illustrative embodiments of the present disclosure.

FIG. 4a schematically illustrates a semiconductor device structure 400 at an early stage during fabrication. In accordance with some illustrative embodiments of the present disclosure, the semiconductor device structure 400 may be provided at "front end of line" (FEOL) processing, such as after a silicon-on-insulator (SOI) substrate 401 is provided, the SOI substrate 401 having an active layer 406, a substrate 402 and a buried insulating layer 404 formed on an upper surface of the substrate 402 and below a lower surface of the active layer 406 (similar to the SOI substrates 101 and 201 described above). The SOI substrate 401 may be provided in accordance with smart cut or SIMOX techniques.

In accordance with some illustrative embodiments of the present disclosure, at least one conductive line element may be provided, such as a grid 450. In accordance with some illustrative examples, the grid 450 (or the at least one conductive line element) may be formed of tungsten.

Although FIGS. 4a-4d schematically illustrate a grid 450 (or at least one conductive line element), this does not pose any limitation to the present disclosure, and the person skilled in the art will appreciate that the grid 450 (or the at least one conductive line element) may be omitted.

Figure 4B:
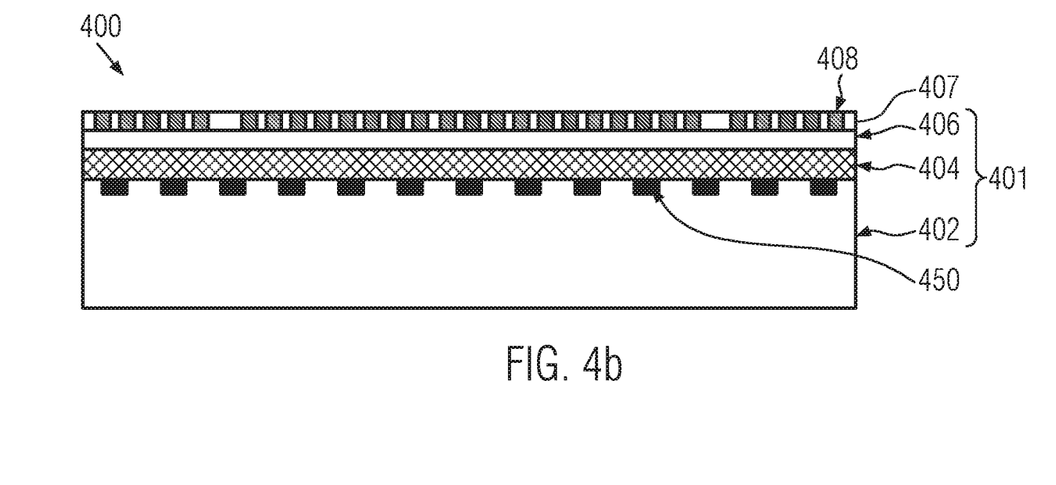

FIG. 4b schematically illustrates the semiconductor device structure 400 at a more advanced stage during fabrication. In accordance with some illustrative examples herein, the semiconductor device structure 400 may be obtained after FEOL processing is completed and a plurality of gate electrodes 408 is formed over the active layer 406 in an interlayer dielectric (ILD) layer 407, the ILD layer 407 being formed on the active layer 406 after the gate electrodes 408 are formed. For the ease of illustration, FET elements, such as source/drain and silicide regions, contacts and the like, are not explicitly depicted in FIG. 4b.

Figure 4C:
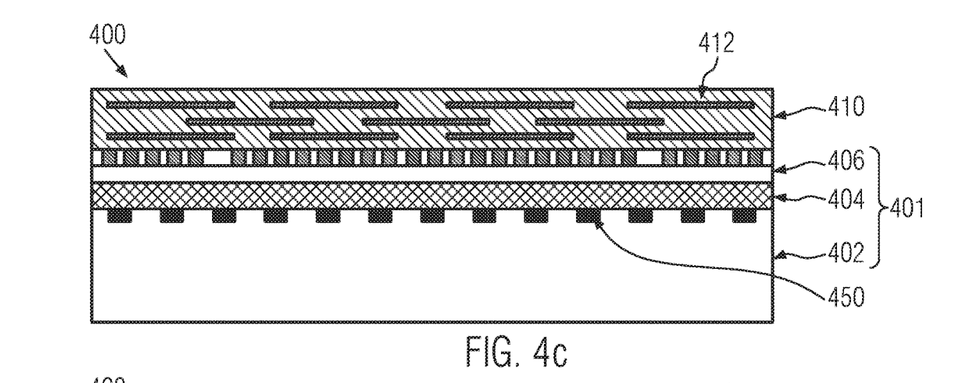

With regard to FIG. 4c, the semiconductor device structure 400 is schematically illustrated at a more advanced stage during fabrication. In accordance with some illustrative embodiments of the present disclosure, the semiconductor device structure 400 of FIG. 4c may be obtained after BEOL processing is completed. In accordance with BEOL processing, a BEOL 410 having a wiring structure 412 may be formed on the SOI substrate 401.

Figure 4D:
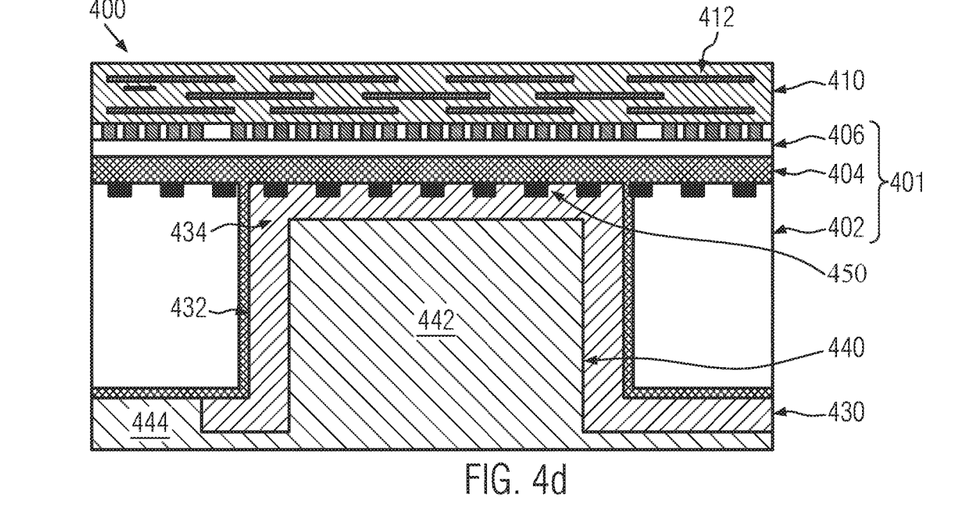

With regard to FIG. 4d, the semiconductor device structure 400 is schematically illustrated at a more advanced stage during fabrication, after at least one vertical connection element 430 is formed in the substrate 402. In accordance with some illustrative embodiments of the present disclosure, the vertical connection element 430 may be formed when providing a redistribution layer (REL) on the backside of the SOI substrate 401.

Returning to FIG. 4a, the person skilled in the art will appreciate that the grid 450 may be formed by using standard processes employed for etching and filling trenches in the substrate 402 prior to the formation of the buried insulating layer 404. In accordance with some illustrative embodiments of the present disclosure, the grid 450 may be provided for providing features for FEOL alignment. In accordance with some illustrative embodiments of the present disclosure, an optional doping process (not illustrated) may be performed in order to provide electrical contact in the substrate 402.

Returning to FIG. 4b, an infrared alignment may be performed for patterning the SOI substrate prior to the formation of the gate electrode 408, wherein an IR camera (not illustrated) may be used to view the metal (e.g., comprising tungsten and the like) grid through the active layer 406. For example, STI (shallow trench isolation, not illustrated) structures may be formed in the active layer 406 prior to the formation of the gate structures 408.

Returning to FIG. 4c, a final via bond (not illustrated) or solder/Cu pillar interconnects (for ease of illustration, not shown) may be provided when BEOL processing is completed.

Returning to FIG. 4d, the formation of the vertical connection elements may be performed concurrently with BS-RDL processing. In accordance with some illustrative examples herein, the semiconductor device 400 may be mounted to a temporary carrier (not illustrated) and standard processing techniques for forming through-silicon vias (TSVs) surrounding at least some of the grid lines of the grid 450 may be formed. The person skilled in the art will appreciate that TSV may represent a high performance interconnect technique used as an alternative to via bonding in flip chips when creating 3D packages and 3D integrated circuits. For example, TSV may be employed during FEOL processing for achieving connections through the active layer 406 of the SOI substrate when contacting the substrate 402 for back-biasing, as known in the art.

In accordance with some illustrative embodiments of the present disclosure, the backside, i.e., the lower surface of the substrate 402, may be patterned and etched for forming recesses in the substrate 402, the recesses (not illustrated) partially exposing the buried insulating layer 404 and, if present, at least some of the grid lines of the grid 450, followed by the formation of the vertical connection element 430 and the filling 440 in case of hollow vertical connection elements. After the completion of the vertical connection elements, the backside redistribution layer is formed in order to provide back-biasing conventions to the vertical connection elements.

Figure 5A:
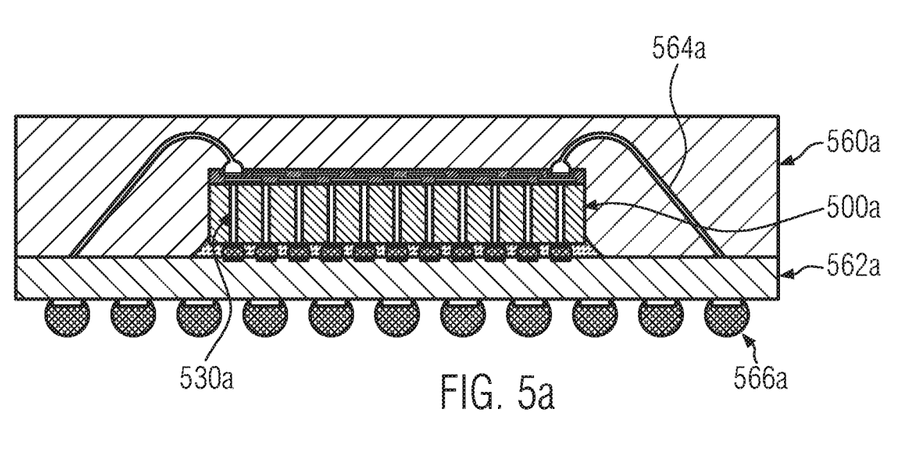
FIGS. 5a and 5b schematically illustrate, in cross-sectional views, various illustrative embodiments of the present disclosure.
Figure 5B:
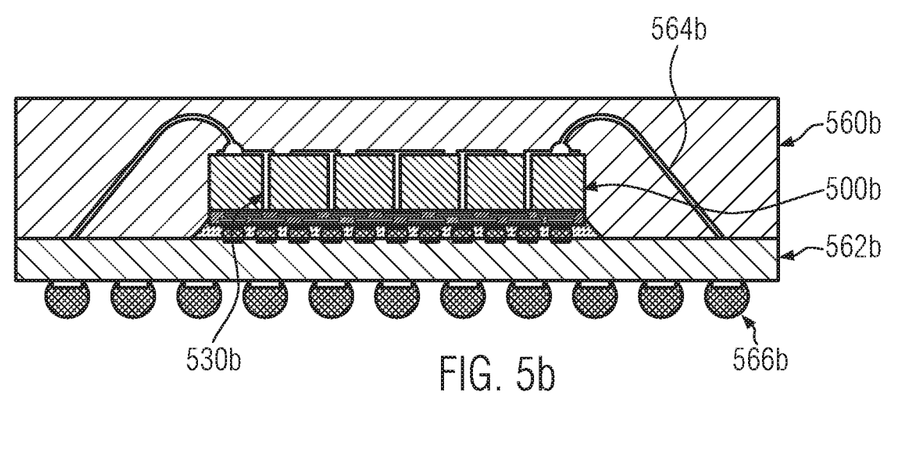

With regard to FIGS. 5*a* and 5*b*, post-BEOL processing is schematically illustrated. In accordance with some illustrative embodiments of the present disclosure, the semiconductor device structures 100-400 as described above with regard to FIGS. 1-4 are provided on a wafer, that is, the SOI substrate 101-401 of FIGS. 1-4 as described above may be regarded as an SOI wafer.

After BEOL processing is completed, processing may be continued by preparing the SOI wafer (not illustrated) for packaging after at least one vertical connection element is formed. Herein, a plurality of dies may be prepared from the SOI wafer (not illustrated). In accordance with some illustrative examples herein, preparation may comprise dicing the wafer into a plurality of dies. For example, the wafer (not illustrated) may be mounted on a plastic tape or some appropriate carrier and the mounted wafer may be cut into separate dies (not illustrated).

After the plurality of dies (not illustrated) is prepared, each of the plurality of dies may be packaged, comprising attaching each of the plurality of dies to a package or a support structure (header).

With regard to FIG. 5*a*, a face-up packaging of a die 500*a* is schematically illustrated, wherein the die 500*a* is mounted on a carrier 562*a* and encapsulated by a package 560*a*. On the carrier 562*a*, solder bonds 566*a* may be present. Electrical connection to the BEOL of the die 500*a* may be achieved by via bonds 564*a*.

With regard to FIG. 5*b*, a face-down (controlled collapse chip connection or C4) packaging of a die 500*b* is schematically illustrated, wherein the die 500*b* is mounted on a carrier 562*b* and encapsulated by a package 560*b*. On the carrier 562*b*, solder bonds 566*b* may be present. Electrical connection to the BEOL of the die 500*b* may be achieved by via bonds 564*b*.

After a complete reading of the present disclosure, the person skilled in the art will appreciate that attaching a die to a package or a support structure may comprise performing one of C4 tape-automated bonding (TAB) and quilt packaging.

In accordance with some illustrative embodiments of the present disclosure, attaching may comprise a combination of via bonds and C4/CuP interconnects.

After a complete reading of the present disclosure, the person skilled in the art will appreciate that after packaging is complete, back-biasing can be applied via vertical connection elements (530*a* and 530*b* in FIGS. 5*a* and 5*b*) and an optional grid (not illustrated) as discussed above with regard to FIGS. 1-4.

In accordance with some illustrative embodiments of the present disclosure, substrate routing and die backside RDL may be combined for biasing connection routing.

After a complete reading of the present disclosure, the person skilled in the art will appreciate that at least some of the above-described illustrative embodiments of the present disclosure may provide a good channel back-biasing control with vertical connection elements on restricted chip areas.

Contrary to known approaches where back-bias is applied for reducing power consumption, the present inventors understand that applying different back-bias conditions may increase the leakage current, however, at the same time increasing on-state current, thereby resulting in higher computation performance of a FET.

In accordance with some illustrative embodiments of the present disclosure, back-biasing may be introduced on at least one selected area of an integrated chip acting on only some FETs, not all FETs within the chip. Herein, the underlying back-biasing layer may be contacted from the back-side of the wafer to save space at the front of the wafer, thereby enabling higher transistor packing density.

In accordance with some illustrative embodiments of the present disclosure, back-biasing may be moved to the back of a wafer by applying well-established technology in terms of TSV, therefore, not adding complexity to existing process flows when at least reducing back-biasing penalty areas.

After a complete reading of the present disclosure, the person skilled in the art will appreciate that area selectivity may enable variability in device selection meant for dynamic operation mode change. In accordance with some special illustrative examples of the present disclosure, the use of a grid may enhance granularity of area selectivity.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Note that the use of terms, such as "first," "second," "third" or "fourth" to describe various processes or structures in this specification and in the attached claims is only used as a short-hand reference to such steps/structures and does not necessarily imply that such steps/structures are performed/formed in that ordered sequence. Of course, depending upon the exact claim language, an ordered sequence of such processes may or may not be required. Accordingly, the protection sought herein is as set forth in the claims below.

What is claimed:

1. A semiconductor device structure, comprising:
   a semiconductor-on-insulator (SOI) substrate comprising an active layer, a substrate and a buried insulating layer positioned on an upper surface of said substrate and below a lower surface of said active layer;
   at least one gate electrode positioned above an upper surface of said active layer;
   a grid of a plurality of grid lines formed in said substrate at said upper surface of said substrate, said grid lines being in mechanical contact with said buried insulating layer; and
   at least one vertical connection element extending between said upper surface of said substrate and an opposite lower surface of said substrate.

2. The semiconductor device structure of claim 1, wherein said vertical connection element comprises a vertical portion which at least partially encloses a dielectric material, said dielectric material being positioned below said lower surface of said substrate and partially extending into said substrate.

3. The semiconductor device structure of claim 2, wherein an outer surface of said vertical connection element is separated from said substrate by an insulating material layer and an inner surface of said vertical connection element is covered by said dielectric material.

4. The semiconductor device structure of claim 3, wherein said insulating material layer comprises one of an oxide material and a nitride material.

5. The semiconductor device structure of claim 2, wherein said dielectric material comprises a deposited polymer material positioned on said lower surface of said substrate.

6. The semiconductor device structure of claim 2, wherein said vertical connection element comprises a horizontal portion that is in mechanical contact with a lower surface of said buried insulating layer.

7. The semiconductor device structure of claim 6, wherein a bottom surface of said horizontal portion of said vertical connection element is covered by said dielectric material.

8. The semiconductor device structure of claim 1, wherein said plurality of grid lines extend horizontally in said substrate at said upper surface of said substrate.

9. The semiconductor device structure of claim 1, wherein at least one of said plurality of grid lines is electrically coupled to said vertical connection element.

10. The semiconductor device structure of claim 1, wherein said grid comprises tungsten.

11. The semiconductor device structure of claim 1, wherein said vertical connection element has one of a circular and a polygonal shape in a cross-sectional view parallel to said upper surface of said substrate.

12. A semiconductor device structure, comprising:
- a semiconductor-on-insulator (SOI) substrate having an active layer, a substrate and a buried insulating layer positioned on an upper surface of said substrate and below a lower surface of said active layer;
- at least one gate electrode positioned above an upper surface of said active layer;
- at least one vertical connection element extending between said upper surface of said substrate and an opposite lower surface of said substrate; and
- a grid comprising a plurality of grid lines positioned in said substrate at said upper surface of said substrate, said plurality of grid lines being in mechanical contact with said buried insulating layer;
- wherein said vertical connection element comprises a vertical portion which at least partially encloses a dielectric material, said dielectric material being positioned below said lower surface of said substrate and partially extending into said substrate, and wherein said vertical connection element further comprises a horizontal portion which at least partially extends between said buried insulating layer and said dielectric material that is at least partially enclosed by said vertical portion of said vertical connection element.

13. The semiconductor device structure of claim 12, wherein an outer surface of said vertical connection element is separated from said substrate by an insulating material layer and an inner surface of said vertical connection element is covered by said dielectric material.

14. The semiconductor device structure of claim 12, wherein said vertical connection element is in mechanical contact with a subset of said plurality of grid lines.

15. The semiconductor device structure of claim 12, wherein said vertical connection element has one of a circular and a polygonal shape in a cross-sectional view parallel to said upper surface of said substrate.

16. A semiconductor device structure, comprising:
- a semiconductor-on-insulator (SOI) substrate comprising an active layer, a substrate and a buried insulating layer positioned on an upper surface of said substrate and below a lower surface of said active layer;
- at least one gate electrode positioned above an upper surface of said active layer;
- a grid of a plurality of grid lines formed in said substrate at said upper surface of said substrate, said grid lines being in mechanical contact with said buried insulating layer; and
- at least one vertical connection element extending between said upper surface of said substrate and an opposite lower surface of said substrate, wherein said vertical connection element is in mechanical contact with a subset of said plurality of grid lines.

17. The semiconductor device structure of claim 16, wherein an outer surface of said vertical connection element is separated from said substrate by an insulating material layer.

18. The semiconductor device structure of claim 17, wherein said insulating material layer comprises one of an oxide material and a nitride material.

19. The semiconductor device structure of claim 16, wherein each grid line of said subset of said plurality of grid lines is electrically coupled to said vertical connection element.

20. The semiconductor device structure of claim 16, wherein said vertical connection element has one of a circular and a polygonal shape in a cross-sectional view parallel to said upper surface of said substrate.

* * * * *